(12) United States Patent
Yim et al.

(10) Patent No.: US 8,530,280 B2
(45) Date of Patent: Sep. 10, 2013

(54) INTEGRATED CIRCUIT PACKAGE SYSTEM WITH CONTOURED ENCAPSULATION AND METHOD FOR MANUFACTURING THEREOF

(75) Inventors: Choong Bin Yim, Seongnam-si (KR); Young Cheol Kim, Yongin-si (KR)

(73) Assignee: Stats Chippac Ltd., Singapore (SG)

( * ) Notice: Subject to any disclaimer, the term of this patent is extended or adjusted under 35 U.S.C. 154(b) by 128 days.

(21) Appl. No.: 13/178,347

(22) Filed: Jul. 7, 2011

(65) Prior Publication Data
US 2011/0260313 A1   Oct. 27, 2011

Related U.S. Application Data

(63) Continuation of application No. 11/735,397, filed on Apr. 13, 2007, now Pat. No. 7,985,623.

(60) Provisional application No. 60/744,914, filed on Apr. 14, 2006.

(51) Int. Cl.
*H01L 21/44* (2006.01)

(52) U.S. Cl.
USPC .................................. 438/112; 257/E21.503

(58) Field of Classification Search
USPC .................. 438/108, 112; 257/788, E21.503
See application file for complete search history.

(56) References Cited

U.S. PATENT DOCUMENTS

| | | | |
|---|---|---|---|
| 5,864,178 A * | 1/1999 | Yamada et al. | 257/737 |
| 6,340,792 B1 | 1/2002 | Hirokawa | |
| 6,562,272 B1 | 5/2003 | Chang et al. | |
| 6,596,212 B1 | 7/2003 | LoBianco et al. | |
| 6,617,684 B2 | 9/2003 | Akram et al. | |
| 6,661,084 B1 | 12/2003 | Peterson et al. | |
| 6,861,761 B2 | 3/2005 | Yang et al. | |
| 6,936,922 B1 | 8/2005 | Park et al. | |
| 6,949,834 B2 | 9/2005 | Connell et al. | |
| 6,972,482 B2 | 12/2005 | Salta, III | |
| 7,239,029 B2 | 7/2007 | Bolken et al. | |
| 7,245,008 B2 | 7/2007 | Lee | |
| 7,259,455 B2 | 8/2007 | Seto | |
| 7,985,623 B2 * | 7/2011 | Yim et al. | 438/112 |
| 2007/0216008 A1 * | 9/2007 | Gerber | 257/686 |
| 2008/0246135 A1 | 10/2008 | Wong et al. | |

* cited by examiner

*Primary Examiner* — Quoc Hoang
(74) *Attorney, Agent, or Firm* — Ishimaru & Associates LLP

(57) ABSTRACT

A method for manufacturing an integrated circuit package system includes: providing a carrier; mounting an integrated circuit die on a top side of the carrier; connecting the integrated circuit die with the carrier; forming an encapsulation having a multi-sloped side over the integrated circuit die for reducing ejection stress; and forming a first external interconnect on the top side of the carrier adjacent to and separated from the encapsulation including forming a second external interconnect on a bottom side of the carrier opposite the first external interconnect.

18 Claims, 4 Drawing Sheets

INTEGRATED CIRCUIT PACKAGE SYSTEM WITH CONTOURED ENCAPSULATION AND METHOD FOR MANUFACTURING THEREOF

CROSS-REFERENCE TO RELATED APPLICATION(S)

This application is a continuation of U.S. patent application Ser. No. 11/735,397 filed Apr. 13, 2007, now U.S. Pat. No. 7,985,623, which claims the benefit of U.S. Provisional Patent Application Ser. No. 60/744,914 filed Apr. 14, 2006.

TECHNICAL FIELD

The present invention relates generally to integrated circuit package system, and more particularly to integrated circuit package system with encapsulation.

BACKGROUND ART

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Many conventional semiconductor die (or "chip") packages are of the type where a semiconductor die is molded into a package with a resin, such as an epoxy molding compound. Drawbacks of conventional designs include a relatively large footprint of the package on the mounting surface of motherboard. The footprint reflects what is typically the maximum dimension of the package, namely, the x-y dimension of the package.

In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect and large footprint top packages have plagued previous stacked package or package on package designs.

Manufacturers have also been trying to reduce the size of encapsulant for individual packages. Unfortunately, if insufficient encapsulant is used, proper sealing of the components is not obtained or the encapsulant will peel from the package substrate.

Thus, a need still remains for an integrated circuit package system providing low cost manufacturing and improved yield for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: providing a carrier; mounting an integrated circuit die on a top side of the carrier; connecting the integrated circuit die with the carrier; forming an encapsulation having a multi-sloped side over the integrated circuit die for reducing ejection stress; and forming a first external interconnect on the top side of the carrier adjacent to and separated from the encapsulation including forming a second external interconnect on a bottom side of the carrier opposite the first external interconnect.

The present invention provides an integrated circuit package system including: a carrier; an integrated circuit die on a top side of the carrier; an encapsulation having a multi-sloped side over the integrated circuit die for reducing ejection stress; and a first external interconnect formed on the top side of the carrier adjacent to and separated from the encapsulation includes a second external interconnect formed on a bottom side of the carrier opposite the first external interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
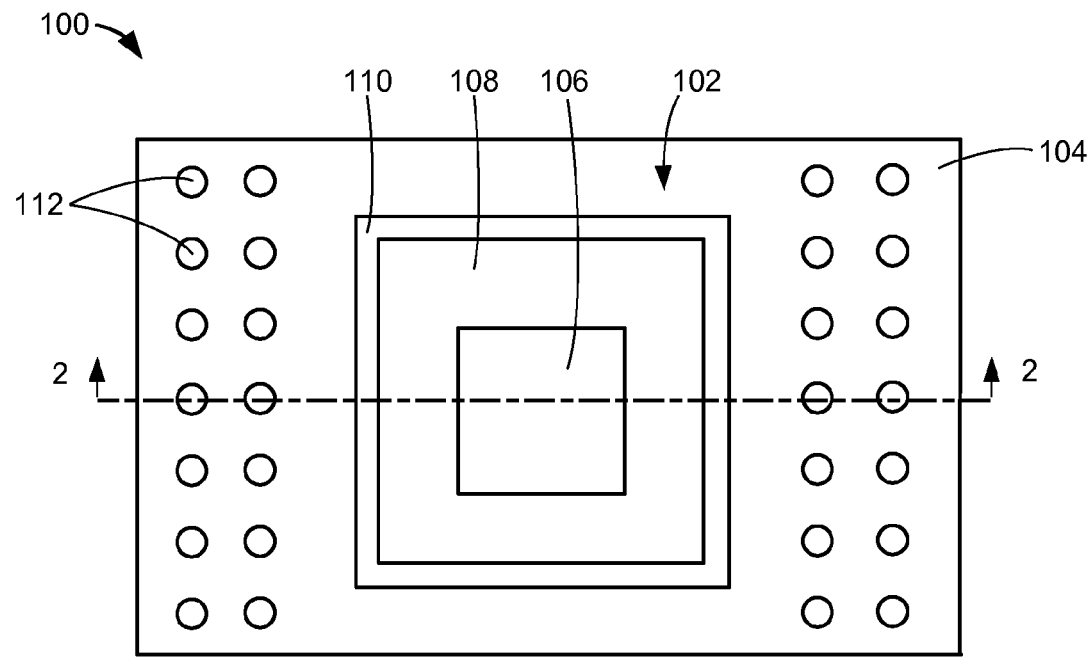
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an encapsulation 102, such as an epoxy mold compound or a thermally resistive plastic, over a carrier 104, such as laminated substrate or lead frame carrier.

The encapsulation 102 includes a first region 106, a second region 108, and a third region 110 forming a contour of the encapsulation 102. From the top view, the first region 106 is shown as a central region or central portion of the encapsulation 102. The third region 110 is a peripheral region or peripheral portion of the encapsulation 102 adjacent to the carrier 104. The second region 108 is an intermediate region or intermediate portion of the encapsulation 102 between the first region 106 and the third region 110. For illustrative purposes, the first region 106, the second region 108, and the third region 110 are shown in a symmetrical configuration relative to a center of the encapsulation 102, although it is understood that the contour of the encapsulation 102 may not be symmetrical.

First external interconnects 112 are also shown over the carrier 104. The first external interconnects 112 may be formed as a number of different structures with different materials, such as conductive bumps, conductive balls, conductive posts, solder bumps, gold bumps, solder balls, or gold balls. The first external interconnects 112 provide connection structures for stacking the integrated circuit package system 100 under another device (not shown), such as another integrated circuit package system. The first external interconnects 112 are formed adjacent to and separated from the encapsulation 102 and may have multiple rows on the carrier 104. For illustrative purposes, the integrated circuit package system 100 is shown having the first external interconnects 112 in two rows, although it is understood that the integrated circuit package system 100 may have a different number of rows of the first external interconnects 112.

Figure 2:
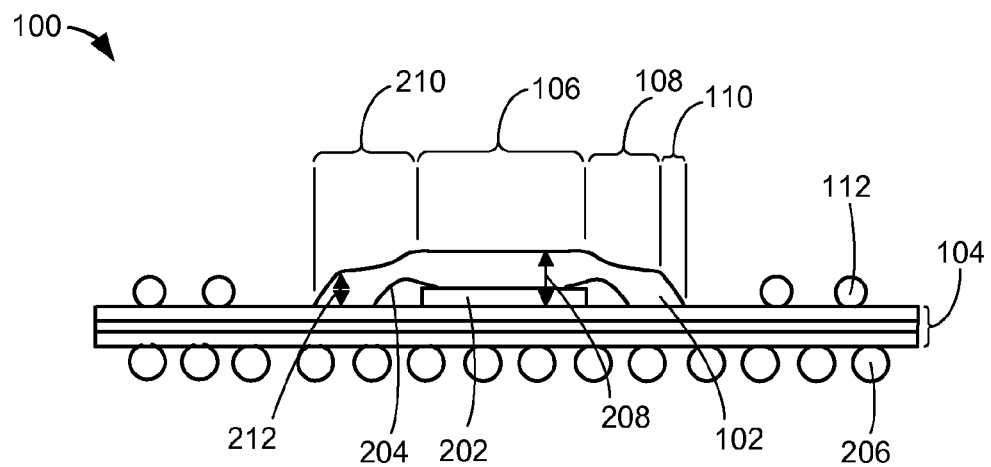
FIG. 2 is a cross-sectional view of the integrated circuit package system of FIG. 1 along line 2-2.

Referring now to FIG. 2, therein is shown a cross-sectional view of the integrated circuit package system 100 of FIG. 1 along line 2-2. The cross-sectional view depicts an integrated circuit die 202 mounted directly on a flat top side of the carrier 104. Internal interconnects 204, such as bond wires, connect the integrated circuit die 202 and the carrier 104. The encapsulation 102 covers the integrated circuit die 202 and the internal interconnects 204 over the carrier 104 without impeding the first external interconnects 112. Second external interconnects 206, such as solder balls, are attach directly on a bottom side of the carrier 104 opposite the first external interconnects 112.

For illustrative purposes, the integrated circuit die 202 is shown as a wire bonded integrated circuit, although it is understood that the integrated circuit die 202 may be a different type of integrated circuit. For example, the integrated circuit die 202 may be a flip chip, a packaged device, or a stack of integrated circuits.

The first region 106 is shown as a horizontal and central portion of the encapsulation 102. The encapsulation 102 has a first thickness 208 at the first region 106, wherein the first thickness 208 is the thickest portion of the encapsulation 102. The second region 108 and the third region 110 form sidewalls 210 of the encapsulation 102 and the contour, such as an S-shaped contour, of the sidewalls 210.

The second region 108 is shown as a curved and intermediate region between the first region 106 and the third region 110. The encapsulation 102 at the second region 108 is concaved eliminating some of the molding compound material from the encapsulation 102. The elimination of a portion of the encapsulation 102 reduces the size and weight of the integrated circuit package system 100. The inward curvature of the second region 108 does not impede the internal interconnects 204 or the integrated circuit die 202.

The third region 110 is shown as a sloped and peripheral region between the second region 108 and the carrier 104. The encapsulation 102 has a second thickness 212 at the intersection between the second region 108 and the third region 110.

The encapsulation 102 may be formed in a number of different ways. For example, the carrier 104 having the integrated circuit die 202 connected thereon may be placed in a mold chase (not shown) or under a mold cap (not shown). The molding compound may be injected or flowed into the mold chase or mold cap forming the encapsulation 102. The mold chase or mold cap forms the contour of the encapsulation 102. After cooling or curing of the encapsulation 102, the integrated circuit package system 100 is ejected or removed from the mold chase. The ejection may be performed with ejection pins.

It has been discovered that the encapsulation 102 having the second thickness 212 20% less than the first thickness 208 has numerous benefits. For example, the contour of the encapsulation 102 reduces ejection stress thus, reducing damage to the encapsulation 102 and increasing yield. The rounded corners of the encapsulation 102 further resist cracking or chipping compared to sharp edges. Also, the contour of the encapsulation 102 prevents mold gate chipping by increasing the mold volume of at the first region 106 or the mold gate area thereby increasing the mechanical strength of the encapsulation 102.

Figure 3:
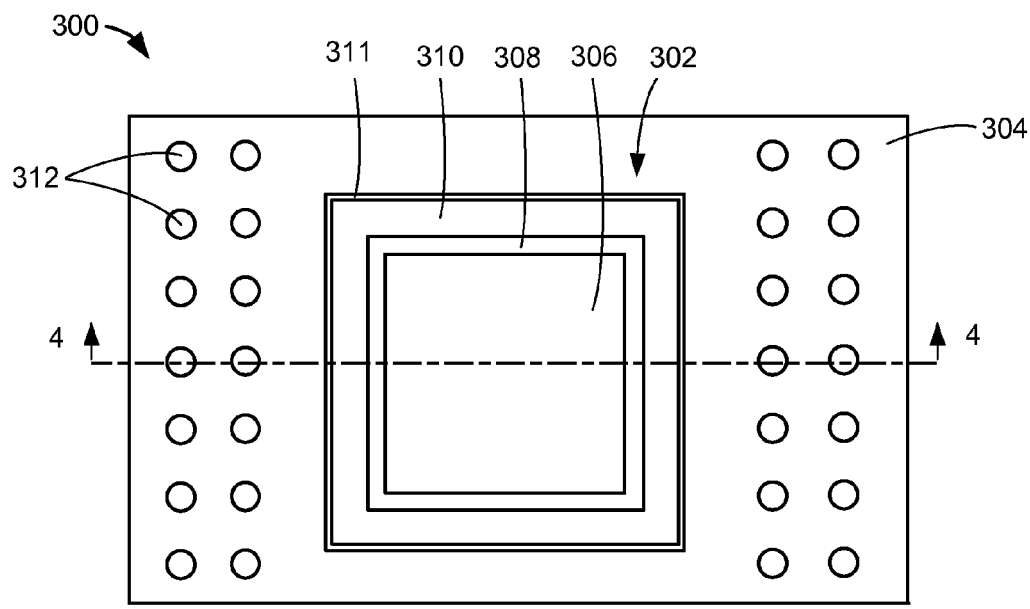
FIG. 3 is a top view of an integrated circuit package system in a second embodiment of the present invention.

Referring now to FIG. 3, therein is shown a top view of an integrated circuit package system 300 in a second embodiment of the present invention. The top view depicts an encapsulation 302, such as an epoxy mold compound or a thermally resistive plastic, over a carrier 304, such as laminated substrate or lead frame carrier.

The encapsulation 302 includes a first region 306, a second region 308, a third region 310, and a fourth region 311 forming a contour of the encapsulation 302. From the top view, the first region 306 is shown as a central region or central portion of the encapsulation 302. The fourth region 311 is a peripheral region or peripheral portion of the encapsulation 302 adjacent to the carrier 304. The second region 308 is an intermediate region or intermediate portion of the encapsulation 302 between the first region 306 and the third region 310. The third region 310 is another intermediate region or portion of the encapsulation 302 between the second region 308 and the fourth region 311. For illustrative purposes, the first region 306, the second region 308, the third region 310, and the fourth region 311 are shown in a symmetrical configuration relative to a center of the encapsulation 302, although it is understood that the contour of the encapsulation 302 may not be symmetrical.

First external interconnects 312 are also shown over the carrier 304. The first external interconnects 312 may be formed as a number of different structures with different materials, such as conductive bumps, conductive balls, conductive posts, solder bumps, gold bumps, solder balls, or gold balls. The first external interconnects 312 provide connection structures for stacking the integrated circuit package system 300 under another device (not shown), such as another integrated circuit package system. For illustrative purposes, the integrated circuit package system 300 is shown having the first external interconnects 312, although it is understood that the integrated circuit package system 300 may not have the first external interconnects 312.

Figure 4:
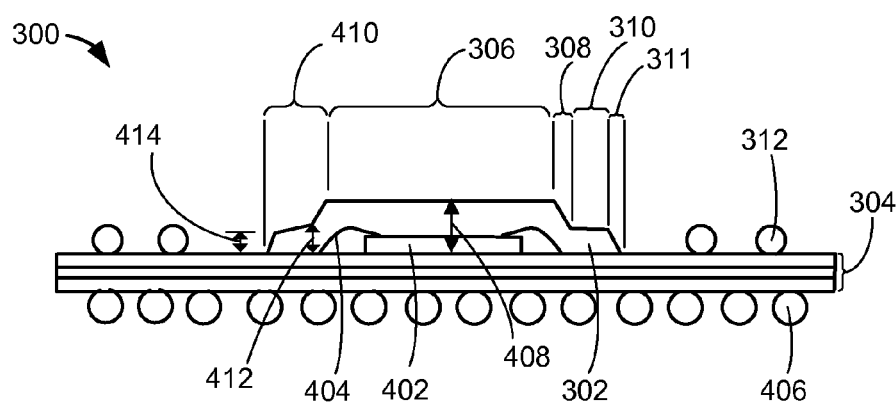
FIG. 4 is a cross-sectional view of the integrated circuit package system of FIG. 3 along line 4-4.

Referring now to FIG. 4, therein is shown a cross-sectional view of the integrated circuit package system 300 of FIG. 3 along line 4-4. The cross-sectional view depicts an integrated circuit die 402 mounted over the carrier 304. Internal interconnects 404, such as bond wires, connect the integrated circuit die 402 and the carrier 304. The encapsulation 302 covers the integrated circuit die 402 and the internal interconnects 404 over the carrier 304 without impeding the first external interconnects 312. Second external interconnects 406, such as solder balls, attach to the carrier 304 at a side opposite the first external interconnects 312. For illustrative purposes, the integrated circuit die 402 is shown as a wire bonded integrated circuit, although it is understood that the integrated circuit die 402 may be a different type of integrated circuit, such as a flip chip, a packaged device, or a stack of integrated circuits.

The first region 306 is shown as a horizontal and central portion of the encapsulation 302. The encapsulation 302 has a first thickness 408 at the first region 306, wherein the first thickness 408 is the thickest portion of the encapsulation 302. The second region 308, the third region 310, and the fourth region 311 form sidewalls 410 of the encapsulation 302 and the contour, such as a multi-sloped contour, of the sidewalls 410.

The second region 308 is shown as a sloped and intermediate region between the first region 306 and the third region 310. The third region 310 is shown as another sloped and intermediate region between the second region 308 and the fourth region 311. The slope of the second region 308 differs from the slope of the third region 310 forming a beveled indentation in the encapsulation 302.

The beveled indentation in the encapsulation 302 eliminates some of the molding compound material from the encapsulation 302. The elimination of a portion of the encapsulation 302 reduces the size and weight of the integrated circuit package system 300. The beveled indentation formed from the second region 308 and the third region 310 does not impede the internal interconnects 404 or the integrated circuit die 402.

The fourth region 311 is shown as a sloped and peripheral region between the third region 310 and the carrier 304. The slope of the third region 310 differs from the slope of the fourth region 311. The encapsulation 302 has a second thickness 412 at the intersection between the second region 308 and the third region 310. The encapsulation 302 also has a third thickness 414 at the intersection between the third region 310 and the fourth region 311.

The encapsulation 302 may be formed in a number of different ways. For example, the carrier 304 having the integrated circuit die 402 connected thereon may be placed in a mold chase (not shown) or under a mold cap (not shown). The molding compound may be injected or flowed into the mold chase or mold cap forming the encapsulation 302. The mold chase or mold cap forms the contour of the encapsulation 302. After cooling or curing of the encapsulation 302, the integrated circuit package system 300 is ejected or removed from the mold chase. The ejection may be performed with ejection pins.

It has been discovered that the encapsulation 302 having the second thickness 412 20% less than the first thickness 408 has numerous benefits. For example, the contour of the encapsulation 302 reduces ejection stress reducing damage to the encapsulation 302 and increasing yield. Also, the contour of the encapsulation 302 prevents mold gate chipping by increasing the mold volume of at the first region 306 or the mold gate area thereby increasing the mechanical strength of the encapsulation 302.

Figure 5:
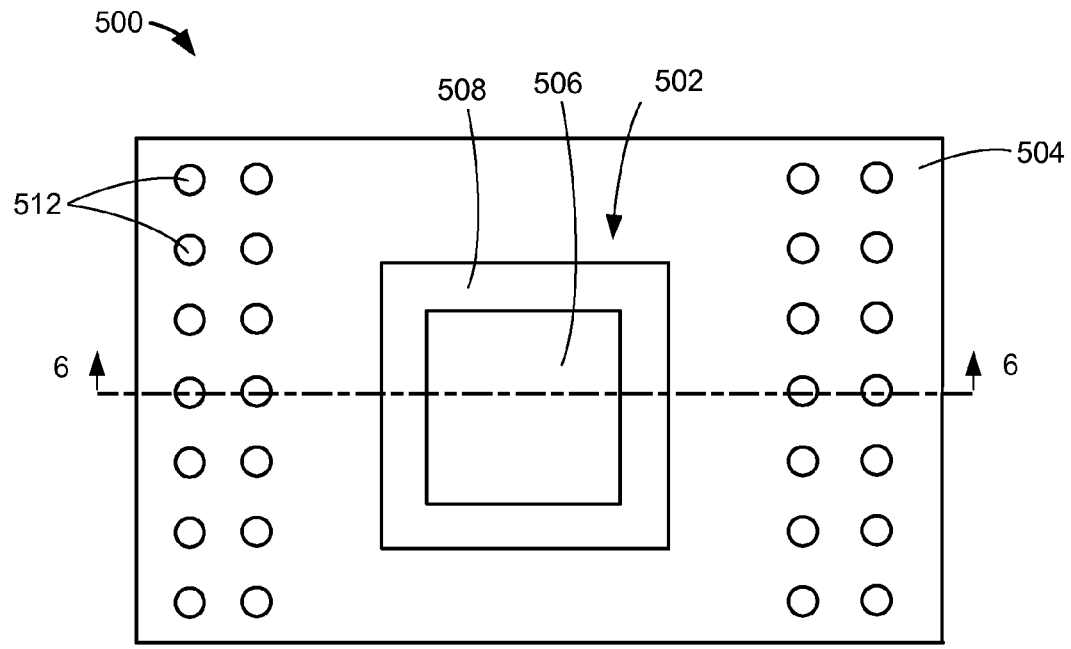
FIG. 5 is a top view of an integrated circuit package system in a third embodiment of the present invention.

Referring now to FIG. 5, therein is shown a top view of an integrated circuit package system 500 in a third embodiment of the present invention. The top view depicts an encapsulation 502, such as an epoxy mold compound or a thermally resistive plastic, over a carrier 504, such as laminated substrate or lead frame carrier.

The encapsulation 502 includes a first region 506 and a second region 508 forming a contour of the encapsulation 502. From the top view, the first region 506 is shown as a central region or central portion of the encapsulation 502. The second region 508 is a peripheral region or peripheral portion of the encapsulation 502 between the carrier 504 and the first region 506. For illustrative purposes, the first region 506 and the second region 508 are shown in a symmetrical configuration relative to a center of the encapsulation 502, although it is understood that the contour of the encapsulation 502 may not be symmetrical.

First external interconnects 512 are also shown over the carrier 504. The first external interconnects 512 may be formed as a number of different structures with different materials, such as conductive bumps, conductive balls, conductive posts, solder bumps, gold bumps, solder balls, or gold balls. The first external interconnects 512 provide connection structures for stacking the integrated circuit package system 500 under another device (not shown), such as another integrated circuit package system. For illustrative purposes, the integrated circuit package system 500 is shown having the first external interconnects 512, although it is understood that the integrated circuit package system 500 may not have the first external interconnects 512.

Figure 6:
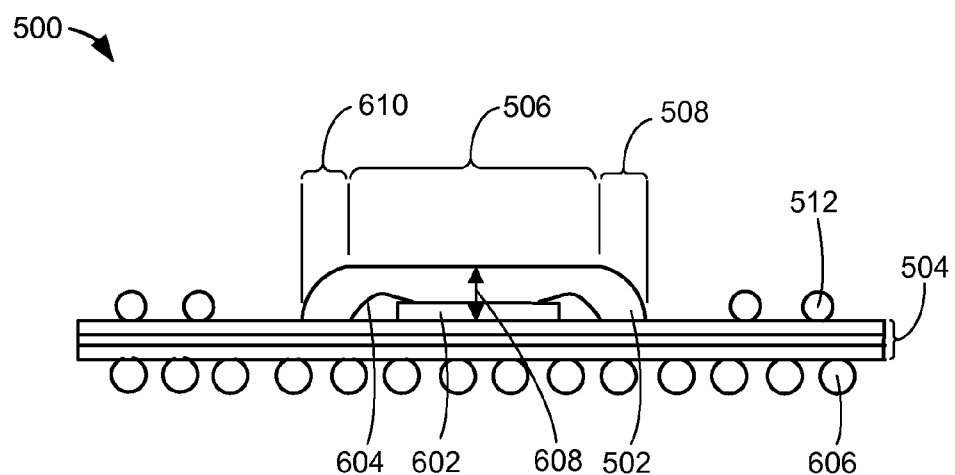
FIG. 6 is a cross-sectional view of the integrated circuit package system of FIG. 5 along line 6-6.

Referring now to FIG. 6, therein is shown a cross-sectional view of the integrated circuit package system 500 of FIG. 5 along line 6-6. The cross-sectional view depicts an integrated circuit die 602 mounted over the carrier 504. Internal interconnects 604, such as bond wires, connect the integrated circuit die 602 and the carrier 504. The encapsulation 502 covers the integrated circuit die 602 and the internal interconnects 604 over the carrier 504 without impeding the first external interconnects 512. Second external interconnects 606, such as solder balls, attach to the carrier 504 at a side opposite the first external interconnects 512. For illustrative purposes, the integrated circuit die 602 is shown as a wire bonded integrated circuit, although it is understood that the integrated circuit die 602 may be a different type of integrated circuit, such as a flip chip, a packaged device, or a stack of integrated circuits.

The first region 506 is shown as a horizontal and central portion of the encapsulation 502. The encapsulation 502 has a first thickness 608 at the first region 506, wherein the first thickness 608 is the thickest portion of the encapsulation 502. The second region 508 forms sidewalls 610 of the encapsulation 502 and the contour, such as a curved contour, of the sidewalls 610.

The second region 508 is between the first region 506 and the carrier 504. The encapsulation 502 at the second region 508 is convexed allowing space for the internal interconnects 604 and allowing reduction of the first thickness 608. The reduction of the first thickness 608 eliminates some of the molding compound material from the encapsulation 502. The elimination of a portion of the encapsulation 502 reduces the size and weight of the integrated circuit package system 500. The first region 506 does not impede the internal interconnects 604 or the integrated circuit die 602.

The encapsulation 502 may be formed in a number of different ways. For example, the carrier 504 having the integrated circuit die 602 connected thereon may be placed in a mold chase (not shown) or under a mold cap (not shown). The molding compound may be injected or flowed into the mold chase or mold cap forming the encapsulation 502. The mold chase or mold cap forms the contour of the encapsulation 502. After cooling or curing of the encapsulation 502, the integrated circuit package system 500 is ejected or removed from the mold chase. The ejection may be performed with ejection pins. The contour of the encapsulation 502 reduces ejection stress reducing damage to the encapsulation 502 and increasing yield.

It has been discovered that the encapsulation 502 having the sidewall 610 in a circular configuration with a radius greater than 0.125 mm has numerous benefits. For example, the curved contour of the encapsulation 502 reduces ejection stress reducing damage to the encapsulation 502 and increasing yield. The rounded corners of the encapsulation 502 further resist cracking or chipping compared to sharp edges. Also, the contour of the encapsulation 502 prevents mold gate chipping by increasing the mold volume of at the first region 506 or the mold gate area thereby increasing the mechanical strength of the encapsulation 502.

Figure 7:
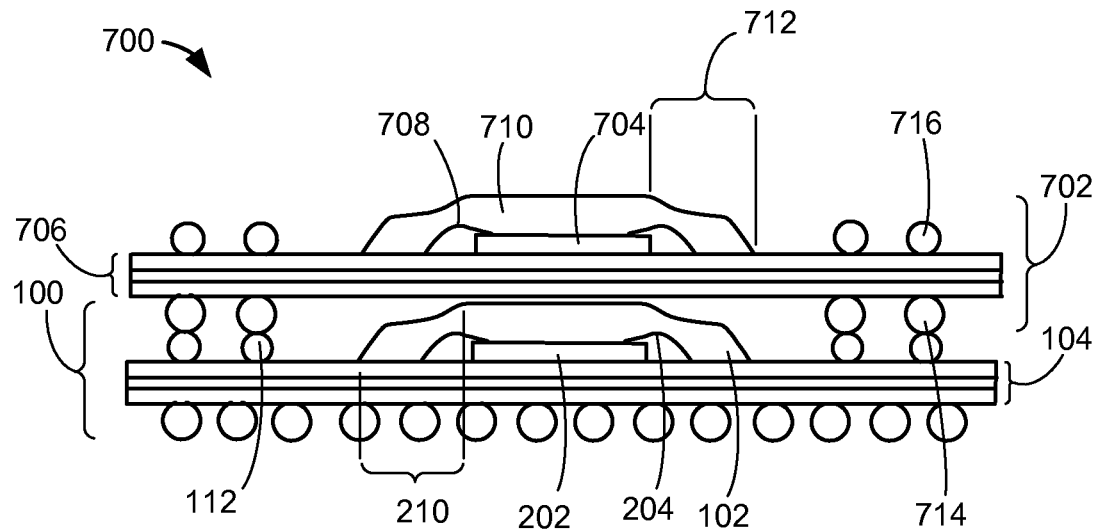
FIG. 7 is a cross-sectional view of an integrated circuit package-on-package system in a fourth embodiment of the present invention.

Referring now to FIG. 7, therein is shown a cross-sectional view of an integrated circuit package-on-package system 700 in a fourth embodiment of the present invention. The cross-sectional view depicts a stacking integrated circuit package 702 above the integrated circuit package system 100 forming the integrated circuit package-on-package system 700. The top view of the integrated circuit package system 100 may also represent the top view of the stacking integrated circuit package 702.

The stacking integrated circuit package 702 includes a device 704, such as an integrated circuit die, mounted over a substrate 706, such as laminated substrate or a lead frame carrier. Interconnects 708, such as bond wires, connect the device 704 and the substrate 706.

A molded cover 710 covers the integrated circuit die 202 and the internal interconnects 204 over the carrier 104. The molded cover 710 includes cover sides 712 in an S-shaped contour and is similar to the contour of the encapsulation 102 of the integrated circuit package system 100.

Bottom external interconnects 714, such as solder balls, attach to the substrate 706 and the first external interconnects 112. Top external interconnects 716, such as solder balls or solder bumps, attach to the substrate 706 at an opposing side of the bottom external interconnects 714.

For illustrative purposes, the device 704 is shown as a wire bonded integrated circuit, although it is understood that the device 704 may be a different type of integrated circuit, such as a flip chip, a packaged device, or a stack of integrated circuits. Also for illustrative purposes, the stacking integrated circuit package 702 is shown having the top external interconnects 716, although it is understood that the stacking integrated circuit package 702 may not have the top external interconnects 716.

Further for illustrative purposes, the stacking integrated circuit package 702 is shown as the topmost portion of the integrated circuit package-on-package system 700, although it is understood that other devices, such as other integrated circuits or packaged devices, may be stacked above the stacking integrated circuit package 702. Yet further for illustrative purposes, the encapsulation 102 is between the carrier 104 and the substrate 706, although it is understood that the both the encapsulation 102 and the molded cover 710 may be between the carrier 104 and the substrate 706. In this face-to-face configuration, the S-shaped contour of the encapsulation 102 and the molded cover 710 may be complementary such that one of the cover sides 712 may vertically overlap one of the sidewalls 210 reducing the horizontal dimension of the stacked configuration.

Figure 8:
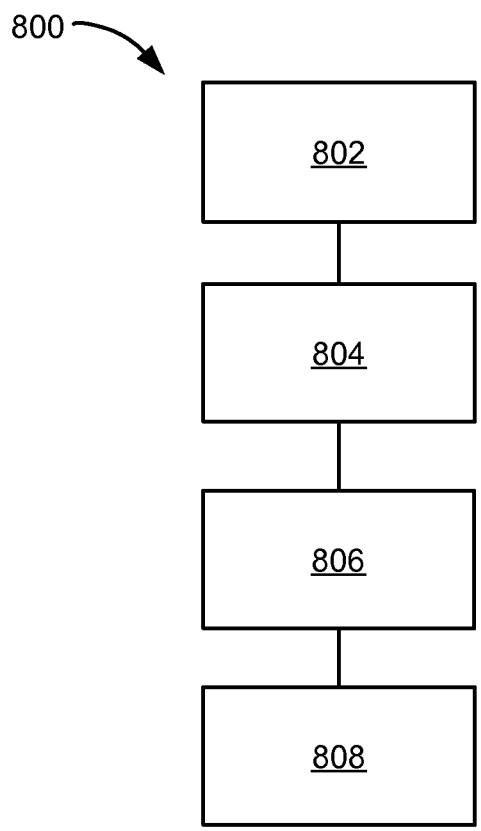
FIG. 8 is a flow chart of an integrated package system for manufacturing the integrated circuit package system in an embodiment of the present invention.

Referring now to FIG. 8, therein is shown a flow chart of an integrated circuit package system 800 for manufacturing the integrated circuit package system 100 in an embodiment of the present invention. The system 800 includes providing a carrier in a block 802; mounting an integrated circuit die on the carrier in a block 804; connecting the integrated circuit die with the carrier in a block 806; and forming an encapsulation having a multi-sloped side over the integrated circuit die for reducing ejection stress in a block 808.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a carrier;
   mounting an integrated circuit die on a flat top side of the carrier;
   connecting the integrated circuit die with the carrier; and
   forming an encapsulation, having a first region and a multi-sloped side as a contour, over the integrated circuit die, and wherein forming the encapsulation includes:
   forming the first region having a first thickness and central to the encapsulation
   forming the contour having a second region and a third region, the second region between and intersecting the first region and the third region, and
   forming the contour having a second thickness at the intersection of the second region and the third region, the second thickness less than twenty percent the first thickness for reducing ejection stress damage.

2. The method as claimed in claim 1 wherein forming the encapsulation having the multi-sloped side includes forming an S-shaped side.

3. The method as claimed in claim 1 further comprising mounting a stacking integrated circuit package over the carrier and the encapsulation.

4. The method as claimed in claim 1 wherein:
   connecting the integrated circuit die with the carrier includes:
   connecting a bond wire between the integrated circuit die and the carrier; and forming the encapsulation having the multi-sloped side further includes:
   forming the encapsulation to substantially conform to the bond wire.

5. A method of manufacturing an integrated circuit package system comprising:
   providing a carrier;
   mounting an integrated circuit die on a flat top side of the carrier;
   connecting a bond wire between the integrated circuit die with the carrier; and
   forming an encapsulation, having a first region and a multi-sloped side as a contour, over the integrated circuit die, and wherein forming the encapsulation includes:
   forming the first region having a first thickness and central to the encapsulation,
   forming the contour having a second region and a third region, the second region between and intersecting the first region and the third region, and
   forming the contour having a second thickness at the intersection of the second region and the third region, the second thickness less than twenty percent the first thickness to substantially conform to the bond wire and for reducing ejection stress.

6. The method as claimed in claim 5 wherein forming the encapsulation includes:
   forming a first region, as the central portion, having the first thickness that is horizontal and adjacent to the multi-sloped side; and
   forming a second region, between the first region and a peripheral portion of the encapsulation having the second thickness.

7. The method as claimed in claim 5 wherein providing the carrier includes providing a substrate.

8. The method as claimed in claim 5 further comprising mounting a stacking integrated circuit package over the carrier and the encapsulation.

9. The method as claimed in claim 5 further comprising attaching an external interconnect with the carrier at an opposing side of the encapsulation.

10. An integrated circuit package system comprising:
    a carrier;
    an integrated circuit die on a flat top side of the carrier; and
    an encapsulation, having a first region and a multi-sloped side as a contour, over the integrated circuit die, and wherein the encapsulation includes:
    the first region having a first thickness and central to the encapsulation,
    the contour having a second region and a third region, the second region between and intersecting the first region and the third region, and
    the contour having a second thickness at the intersection of the second region and the third region, the second thickness less than twenty percent the first thickness for reducing ejection stress damage to the encapsulation.

11. The system as claimed in claim 10 wherein the encapsulation having the multi-sloped side includes an S-shaped side.

12. The system as claimed in claim 10 further comprising a stacking integrated circuit package over the carrier and the encapsulation.

13. The system as claimed in claim 10 further comprising a bond wire between the integrated circuit die and the carrier.

14. The system as claimed in claim 10 further comprising:
    a bond wire between the integrated circuit die and the carrier; and wherein:
    the encapsulation substantially conforms to the bond wire and the integrated circuit die.

15. The system as claimed in claim 14 wherein the encapsulation having the multi-sloped side includes:
    a first region, as the central portion, having the first thickness that is horizontal and adjacent to the multi-sloped side; and
    a second region, between the first region and a peripheral portion of the encapsulation having the second thickness.

16. The system as claimed in claim 14 wherein the carrier includes a substrate.

17. The system as claimed in claim 14 further comprising a stacking integrated circuit package over the carrier and the encapsulation.

18. The system as claimed in claim 14 further comprising an external interconnect attached with the carrier at an opposing side of the encapsulation.

* * * * *